United States Patent
Sakurada et al.

(10) Patent No.: US 7,871,666 B2
(45) Date of Patent: Jan. 18, 2011

(54) PATTERN FORMING SYSTEM, PATTERN FORMING METHOD, AND ELECTRONIC APPARATUS

(75) Inventors: Kazuaki Sakurada, Suwa (JP); Noboru Uehara, Okaya (JP); Tsuyoshi Shintate, Matsuyama-machi (JP)

(73) Assignee: Seiko Epson Corporation, Tokyo (JP)

( * ) Notice: Subject to any disclaimer, the term of this patent is extended or adjusted under 35 U.S.C. 154(b) by 175 days.

(21) Appl. No.: 12/232,715

(22) Filed: Sep. 23, 2008

(65) Prior Publication Data

US 2009/0035453 A1    Feb. 5, 2009

Related U.S. Application Data

(62) Division of application No. 11/218,545, filed on Sep. 6, 2005, now Pat. No. 7,462,241.

(30) Foreign Application Priority Data

Oct. 27, 2004  (JP)  ............... 2004-312233

(51) Int. Cl.
*B05D 5/12* (2006.01)
*B05D 3/00* (2006.01)
*B29D 7/00* (2006.01)

(52) U.S. Cl. ............ 427/177; 427/96.1; 427/98.4; 427/171; 427/172; 427/294

(58) Field of Classification Search .......... 427/177, 427/96.1, 98.4, 171, 172, 294
See application file for complete search history.

(56) References Cited

U.S. PATENT DOCUMENTS

| 5,132,248 | A  |   | 7/1992 | Drummond et al. |
|-----------|----|---|--------|-----------------|
| 6,682,171 | B2 | * | 1/2004 | Otsuka ............... 347/43 |
| 2002/0122093 | A1 |   | 9/2002 | Otsuka |
| 2003/0175414 | A1 | * | 9/2003 | Hayashi ............... 427/66 |
| 2004/0074407 | A1 | * | 4/2004 | Iyokawa et al. ......... 101/228 |
| 2006/0088700 | A1 |   | 4/2006 | Miyasaka |

FOREIGN PATENT DOCUMENTS

| JP | A-10-171125 | 6/1998 |
|----|-------------|--------|
| JP | A-2001-171039 | 6/2001 |
| JP | A-2003-094626 | 4/2003 |
| JP | A-2003-280535 | 10/2003 |

* cited by examiner

*Primary Examiner*—Michael Cleveland
*Assistant Examiner*—Michael Wieczorek
(74) *Attorney, Agent, or Firm*—Oliff & Berridge PLC

(57) ABSTRACT

A pattern forming system including a feeding reel for feeding a tape form substrate that is wound up, a winding reel for winding up the tape form substrate that is fed up, and a droplet discharge apparatus for discharging a droplet onto the tape form substrate, between the feeding reel and the winding reel, to form a pattern, wherein the droplet discharge apparatus includes a table that can move while sucking the tape form substrate, with a slack mechanism for the tape form substrate being placed on the both ends of the table in the longitudinal direction of the tape form substrate.

3 Claims, 9 Drawing Sheets

| (S) | (STEP OPERATION) | (APPARATUS) | (CONDITION) |
|---|---|---|---|
| 1 | CLEAN SUBSTRATE | EXCIMER UV (WAVELENGTH 172 nm) | 300 sec |
| 2 | DRAW BANK FOR 0th LAYER INSULATOR FILM | DROPLET DISCHARGE APPARATUS | - |
| 3 | UV HARDEN BANK | UV (WAVELENGTH 365 nm) | 4 sec |
| 4 | DRAW 0th LAYER INSULATOR FILM | DROPLET DISCHARGE APPARATUS | - |
| 5 | UV HARDEN | UV (WAVELENGTH 365 nm) | 60 sec |
| 6 | CONTROL CONTACT ANGLE FOR 1st LAYER Ag | EXCIMER UV (WAVELENGTH 172 nm) | 15 sec |
| 7 | DRAW 1st LAYER Ag WIRING | DROPLET DISCHARGE APPARATUS | - |
| 8 | BAKE Ag | HOT PLATE | 150 °C × 30 min |
| 9 | DRAW 1st LAYER Ag POST | DROPLET DISCHARGE APPARATUS | - |
| 10 | BAKE Ag | HOT PLATE | 150 °C × 30 min |
| 11 | CONTROL CONTACT ANGLE FOR 1st LAYER INSULATOR FILM | EXCIMER UV (WAVELENGTH 172 nm) | 60 sec |
| 12 | DRAW 1st LAYER INSULATOR FILM AROUND Ag | DROPLET DISCHARGE APPARATUS | - |
| 13 | LYOPHILIC TREATMENT | EXCIMER UV (WAVELENGTH 172 nm) | 10 sec |
| 14 | UV HARDEN | UV (WAVELENGTH 365 nm) | 4 sec |
| 15 | 1st LAYER INSULATOR FILM | DROPLET DISCHARGE APPARATUS | - |
| 16 | UV HARDEN | UV (WAVELENGTH 365 nm) | 60 sec |
| | ↓ | | |
| | REPEAT S6 - S16 FOR ADDITIONAL LAYERS | | |

FIG. 7

PATTERN FORMING SYSTEM, PATTERN FORMING METHOD, AND ELECTRONIC APPARATUS

This is a Division of application Ser. No. 11/218,545, now U.S. Pat. No. 7,462,241, filed Sep. 6, 2005. The disclosure of the prior application is hereby incorporated by reference herein in its entirety.

BACKGROUND OF THE INVENTION

1. Technical Field

The present invention relates to a pattern forming system, a pattern forming method, and an electronic apparatus.

2. Related Art

Lithography, for example, is used for the manufacturing of wirings that are used in electronic circuits or integrated circuits. Lithography requires huge facilities, such as a vacuum system, and complicated processes. Besides, in the case of using lithography, the manufacturing cost is high because the yield rate is only a few percent and the bulk of material must be thrown out. Therefore, as an alternative process to lithography, a method of patterning a droplet containing a functional material directly onto a substrate by an ink jet (a droplet discharge system) is considered. For example, a method wherein a droplet in which conductive microparticles are dispersed is applied and patterned directly onto a substrate by a droplet discharge system and then transformed into a conductive film pattern by heat treatment and laser irradiation is proposed (refer, for example, to the specification of the U.S. Pat. No. 5,132,248).

Further, a method that can be flexibly adjusted to the kind of manufacturing process to be applied in the manufacturing method of a display unit and a display device using a droplet discharge system is proposed. The method, when a relative velocity of an ink jet head to a substrate is defined as V, a discharge period of droplets as T, and a diameter of the droplets after the droplets land on the substrate and expand to wet as D, controls the relative velocity V, the discharge period T and the diameter D so as to satisfy the relation $VT<D$. Then, droplets are discharged on a substrate on the most appropriate discharging condition according to the kind of manufacturing process to be applied (refer, for example, to Japanese Patent Application Publication 2003-280535).

However, in the manufacturing methods of wirings or display devices according to the above-referenced methods, a platy substrate is processed into a product substrate using a plurality of steps. Therefore, a substrate needs to be moved sequentially from a location (a device) on which a certain step to be carried out to another location on which a next step to be carried out. Thus, in the above-referenced manufacturing methods, there is a problem that manufacturing cost increases because a large amount of labor and mechanism is required to transfer substrates. Specifically, in the above-referenced manufacturing methods, a large amount of labor and a complex moving mechanism such as a robot is required for allocating a surface treatment apparatus, a droplet discharge apparatus, and a drying apparatus and the like and for transferring substrates sequentially toward each of the apparatuses and aligning them precisely.

Therefore, a pattern forming system that uses a reel-to-reel substrate in tape form, each end of which is wound up with reels, and that carries out a plurality of steps, including a droplet applying step by a droplet discharge system, from the feeding of a tape form substrate until the winding up of the tape form substrate is considered. According to the system, patterns can be simply and easily formed on a plurality of pattern forming areas on a tape form substrate by first carrying out a droplet applying step to one pattern forming area and then winding up the tape form substrate to place the next pattern forming area for the droplet applying step. Finally, the tape form substrate is cut off for each pattern forming area. Thus, wirings and electronic circuits can be efficiently manufactured in volume.

However, pulling strength is generated in the longitudinal direction because the tape form substrates are formed successively in the longitudinal direction with each end wound up with reels. Therefore, there is a problem that the position adjustment of a tape form substrate during a droplet applying step and the like is difficult. Especially, position adjustments, such as moving a tape form substrate in the lateral direction or slewing a tape form substrate around a normal line, have to be done coping with the pulling strength that is generated in the longitudinal direction. Thus, it is difficult to form a pattern on a precise position.

SUMMARY

An advantage of the present invention is to provide a pattern forming system and a pattern forming method that can facilitate a position adjustment of a tape form substrate to form a precise pattern. Another advantage is to provide an electronic apparatus that is highly reliable and has a precise pattern.

Therefore, a first aspect of the invention is to provide a pattern forming system that includes a feeding reel for feeding a tape form substrate that is wound up, a winding reel for winding up the tape form substrate that is fed up, and a droplet discharge apparatus for discharging a droplet onto the tape form substrate, between the feeding reel and the winding reel, to form a pattern. The droplet discharge apparatus includes a table that can move while sucking the tape form substrate. A slack mechanism for the tape form substrate is placed on the both ends of the table in the longitudinal direction of the tape form substrate. According to the configuration, the pulling strength generated in the longitudinal direction of the tape form substrate is dissolved because a slack mechanism for the tape form substrate is placed. By moving, in this state of things, the table that sucks the tape form substrate, the position of the tape form substrate can be adjusted. Thus, a pattern forming system capable of forming a precise pattern is provided.

It is preferable that the slack mechanism is configured in a manner of swagging the tape form substrate between a pair of movable rollers that are placed at a certain distance. According to the configuration, a slack mechanism can be configured easily and at a low rate.

It is also preferable that the table on the droplet discharge apparatus is configured so as to at least be able to slew around a normal line of the suction surface of the tape form substrate. According to the configuration, the position of the tape form substrate sucked on the table can be adjusted around the normal line.

It is also preferable that the ink jet head of the droplet discharge apparatus is configured so as to at least be able to scan within the parallel surface of the suction surface of the tape form substrate on the table. According to the configuration, patterns can be formed by discharging a droplet onto any given position of the tape form substrate sucked on the table.

It is also preferable that the slack mechanism has a fixed roller that can interpose the tape form substrate between one of the paired movable rollers, the one that is placed closer to the table. The configuration can prevent the slack of the tape form substrate in the slack mechanism from affecting the table, stabilizing the position of the tape form substrate on the table. Thus, a precise pattern can be formed.

It is also preferable that the slack mechanism has a pulling roller that can bring out pulling strength in the longitudinal direction of the tape form substrate. According to the configuration, pulling strength can be easily brought out to the tape form substrate and the tape form substrate after the pattern forming step can be wound up.

Meanwhile, a second aspect of the invention is to provide a pattern forming method using a pattern forming system that includes a feeding reel for feeding a tape form substrate that is wound up, a winding reel for winding up the tape form substrate that is fed up, and a droplet discharge apparatus for discharging a droplet onto the tape form substrate, between the feeding reel and the winding reel, to form a pattern. The pattern forming method includes letting the tape form substrate that is sucked on the table placed on the droplet discharge apparatus, dissolving the pulling strength generated in the longitudinal direction of the tape form substrate, adjusting the position of the tape form substrate by moving the table, and forming a pattern by discharging a droplet on the tape form substrate by the droplet discharge apparatus. According to the configuration, the position controlling of the tape form substrate can be facilitated and a precise pattern can be formed.

It is preferable that the pattern forming method includes, after forming a pattern by discharging a droplet onto the tape form substrate, releasing the suction of the tape form substrate by the table, bringing out pulling strength in the longitudinal direction of the tape form substrate, and winding up the tape form substrate by the winding reel. According to the configuration, a tape form substrate after a pattern is formed can be wound up easily.

Meanwhile, an electronic apparatus of the invention is manufactured using the above-referenced pattern forming system. According to the configuration, a highly reliable electronic apparatus can be provided because the configuration allows a precise pattern to be generated.

BRIEF DESCRIPTION OF THE DRAWINGS

The invention will be described with reference to the accompanying drawings, wherein like numbers refer to like elements, and wherein:

FIG. 7 is an operation sheet of a wiring pattern forming method;

DESCRIPTION OF THE EMBODIMENTS

A pattern forming system and a pattern forming method according to the embodiments of the invention will now be described with reference to the drawings. A pattern forming method according to the embodiments of the invention can be carried out by using a pattern forming system according to the embodiments of the invention. Here, a pattern forming system and a pattern forming method for forming a wiring composed of a conductive film on a tape form substrate constituting a reel-to-reel substrate will be described as an example.

A Pattern Forming System

Figure 1:
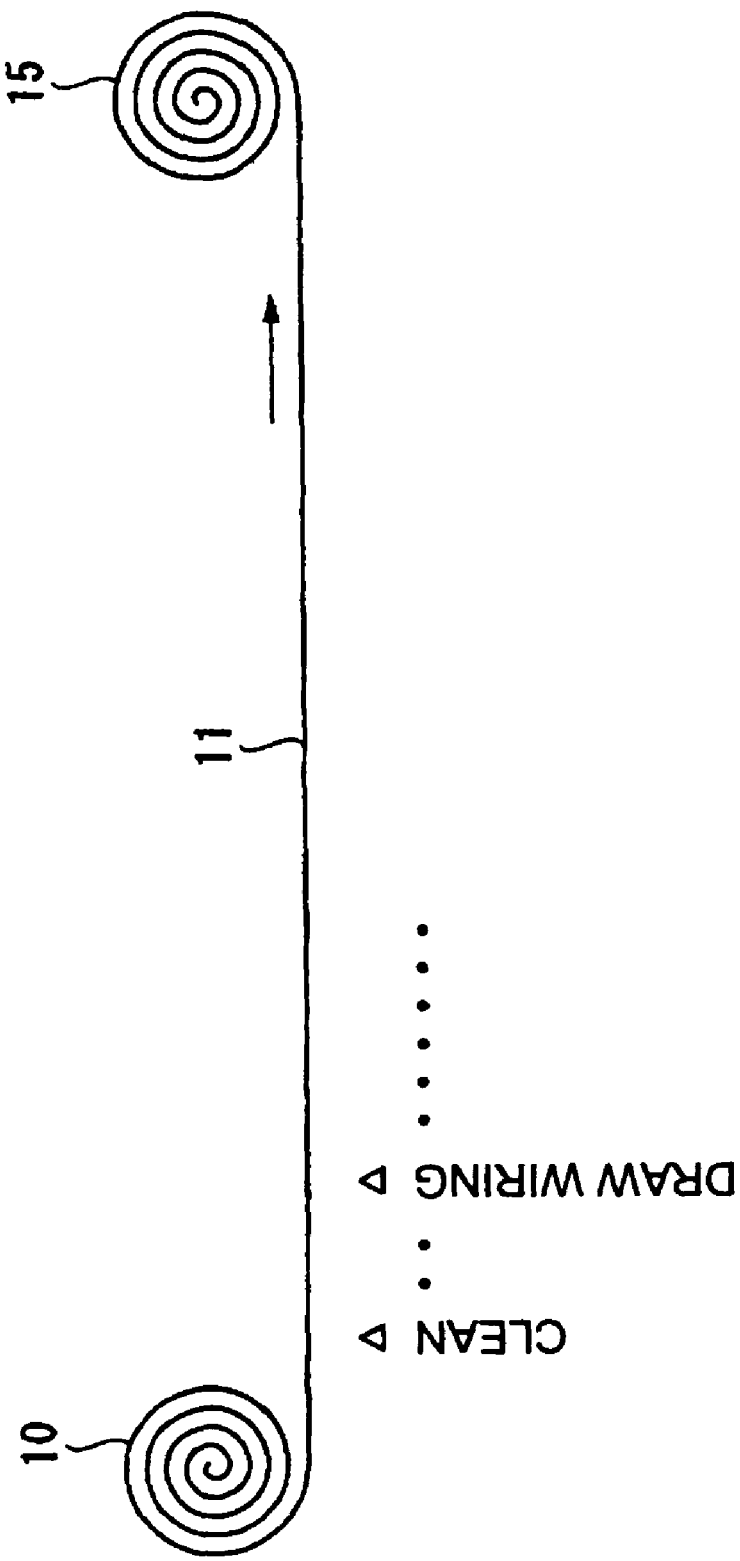
FIG. 1 is a pattern diagram schematically showing a pattern forming system according to an embodiment of the invention.

FIG. 1 is a pattern diagram schematically showing a pattern forming system and a pattern forming method according to an embodiment of the invention. The pattern forming system is composed at least of a feeding reel 10 where a tape form substrate 11 is wound up and a winding reel 15 for winding up a tape form substrate 11 that is fed out from the feeding reel 10.

A zonal flexible substrate, for example, is applied as a tape form substrate 11, using polyimide and the like as a backing material. As a concrete example of a tape form substrate 11, the width may be set to be 105 mm and the length to be 200 mm. The tape form substrate 11 constitutes a reel-to-reel substrate, the both edges of its zonal shape being respectively wound up by the feeding reel 10 and the winding reel 15. Specifically, the tape form substrate 11 fed out from the feeding reel 10 is wound up by the winding reel 15, moving successively in the longitudinal direction (in the feeding direction of the tape form substrate 11).

The pattern forming system includes a plurality of apparatuses that carries out a plurality of steps one by one onto the reel-to-reel substrate composed of a piece of a tape form substrate 11. A cleaning step, a surface treatment step, an insulating film drawing step, an insulating film hardening step, a wiring drawing step, a wiring hardening step and the like are included in the plural steps. Through these steps, a wiring and an insulating film and the like can be generated on the tape form substrate 11.

In the pattern forming system, a number of desired substrate forming areas (hereinafter, simply referred to as a "unit area") are set up at a predetermined interval in the longitudinal direction of the tape form substrate 11. Then, the tape form substrate 11 is moved successively to each of the apparatuses in each of the steps to successively form wiring layers and insulating layers and the like on each of the unit areas on the tape form substrate 11. Specifically, the above-referenced plural steps are carried out on an assembly line, each of the steps being carried out simultaneously or on overlapped timing on the plural apparatuses.

According to the pattern forming system, wirings and electronic circuits and the like can be manufactured efficiently and in volume because patterns (wirings, for example) are generated by using a droplet discharging system onto a tape form substrate constituting a reel-to-reel substrate. For example, a unit area on a tape form substrate can be transferred from an apparatus on which a certain step to be carried out to a next apparatus on which a next step to be carried out only by winding up one edge of the tape form substrate. Therefore, according to the invention, transport mechanism and alignment mechanism for transferring a substrate to each apparatus for each step can be simplified, which lowers the manufacturing cost in the case of volume production or the like.

Figure 2:
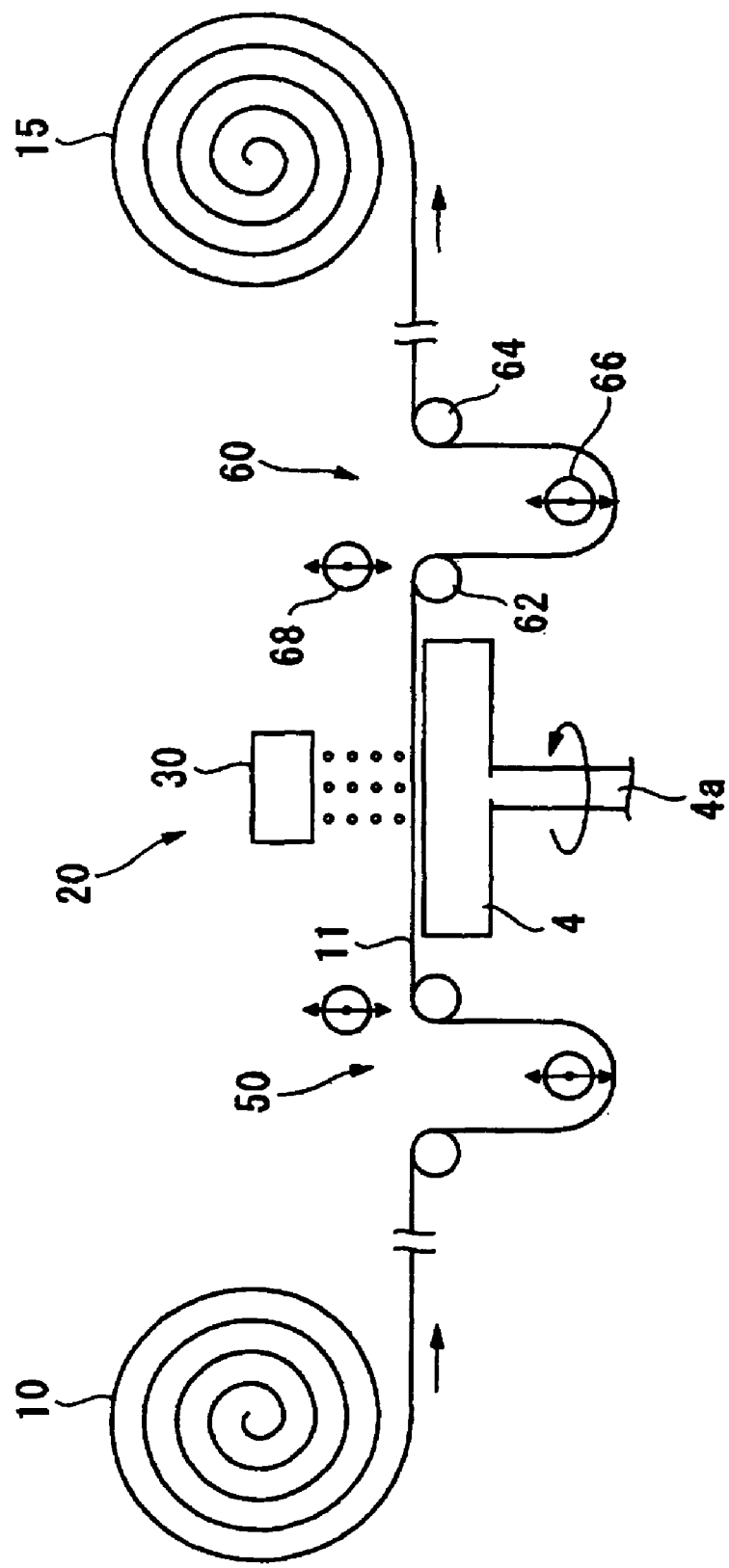
FIG. 2 is a diagram schematically showing a wiring drawing step.
Figure 3:
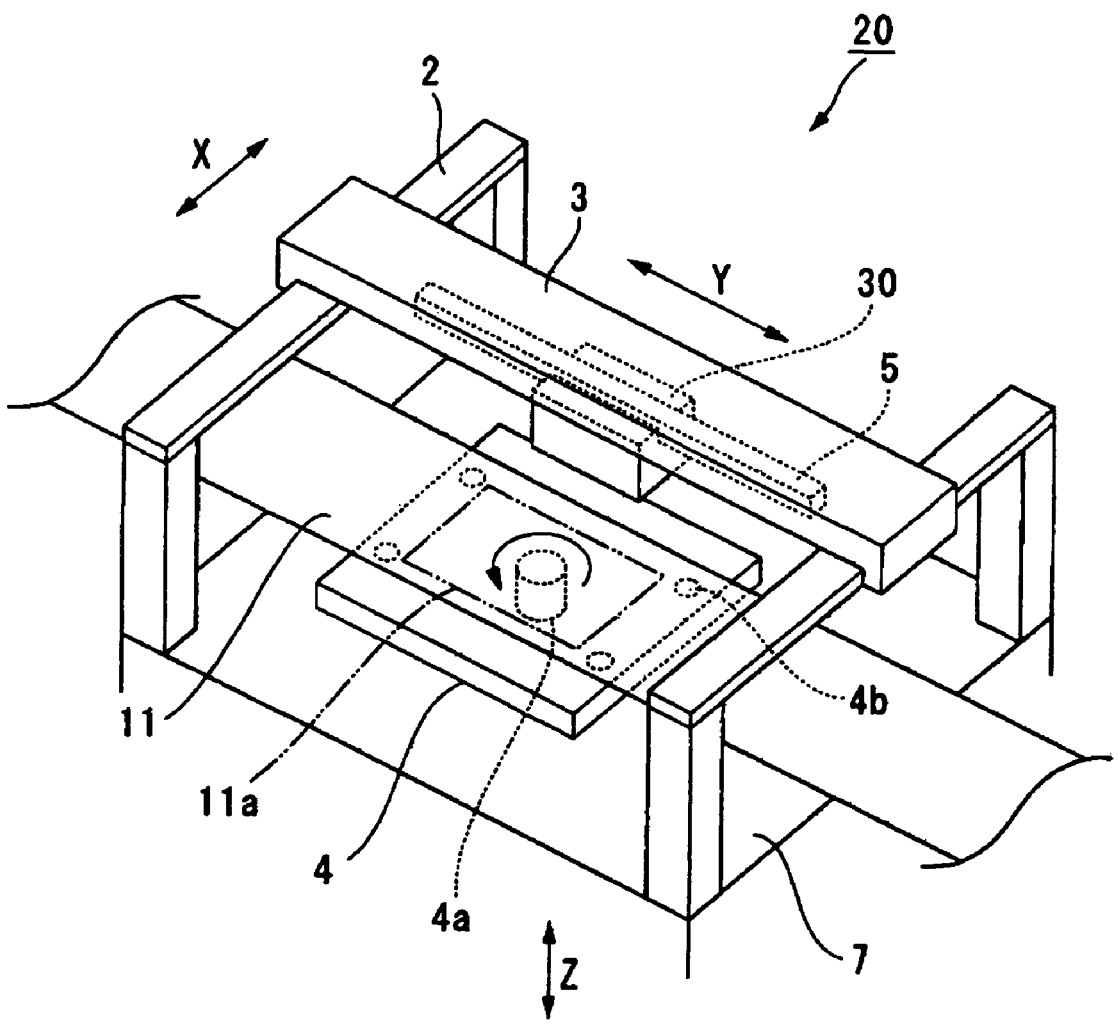
FIG. 3 is an oblique diagram of a droplet discharge apparatus.

FIG. 2 is a diagram schematically showing a wiring drawing step in the pattern forming system. A droplet discharge apparatus 20 is set up in the wiring drawing step. FIG. 3 is an oblique diagram of a droplet discharge apparatus. The droplet discharge apparatus 20 is mainly composed of a table 4 on which a tape form substrate 11 to be placed and an ink jet head 30 for discharging a droplet onto the tape form substrate 11. The surface of the table 4 on which the tape form substrate 11 to be placed is formed larger at least than a unit area 11a on the tape form substrate 11. A suction unit 4*b,* such as a vacuum suction apparatus, is placed on the surface of the table 4 so as to be able to suck the placed tape form substrate 11. A motor 4*a* is placed beneath the table 4. The motor 4*a* is used to slew the table 4 around the normal line direction of the table 4 (in the θ direction). Thus, the position of the tape form substrate 11 that is sucked on the surface of the table 4 can be adjusted in the θ direction.

Meanwhile, the ink jet head 30 is configured so as to be able to move in the longitudinal direction (in the Y direction) of the tape form substrate 11 along a guide 5 that is placed on the undersurface of an arm 3. The arm 3 is configured so as to be able to move in the lateral direction (in the X direction) of the tape form substrate 11 along a guide 2 that is placed at a certain height from a pedestal 7. Thus, an ink jet head 30 can move unrestrainedly within the XY flat surface at a certain height from the tape form substrate 11, allowing a droplet to be discharged onto any predetermined position within a unit area 11*a* on the tape form substrate 11. Further, it is preferable that the ink jet head 30 not only can move in the X and Y directions as well as in the Z direction (in the normal line direction of the tape form substrate 11) but also can slew around the X, Y and Z axes. The inner structure and behavior of the ink jet head 30 will be described later in detail.

Going back to FIG. 2, slack mechanisms 50 and 60 for the tape form substrate 11 are set up on the each end of the table 4 in the longitudinal direction of the tape form substrate 11. Although the slack mechanism 60 that is placed downstream of the wiring drawing step will be now described, the slack mechanism 50 that is placed upstream works just in the same way. The slack mechanism 60 includes a pair of movable rollers 62 and 64 that are placed parallel at a predetermined interval in the horizontal direction. The central axes of the movable rollers 62 and 64 are placed almost vertically to the longitudinal direction of the tape form substrate 11. The tape form substrate 11 is swagged between the paired movable rollers 62 and 64, constituting the slack mechanism 60 for the tape form substrate 11. Thus, the pulling strength that affects the tape form substrate 11 is dissolved by the slack mechanism 60 that is configured easily and at a low rate.

Within the tape form substrate 11 that is swagged between the paired movable rollers 62 and 64, a pulling roller 66 is placed parallel to the movable rollers 62 and 64. The pulling roller 66 is configured so as to be able to move up and down. Then, the slack of the tape form substrate 11 is dissolved by moving downward the pulling roller 66 to press the swagged tape form substrate 11 from inside to outside. Thus, pulling strength can be brought out in the longitudinal direction of the tape form substrate 11 in the feeding of the tape form substrate 11. The tape form substrate 11 can be fed by winding up, in this state of things, the tape form substrate 11 with the winding reel 15.

Above the movable roller 62, that is closer to the table 4, of the paired movable rollers 62 and 64, a fixed roller 68 is placed parallel to the movable rollers 62. The fixed roller 68 is also configured so as to be able to move up and down. Then, by moving downward the fixed roller 68, the tape form substrate 11 is interposed between the movable rollers 62. Thus, the slack of the tape form substrate in the slack mechanism 60 can be prevented from affecting the table 4, stabilizing the position of the tape form substrate 11 on the table 4 during the droplet discharging.

A Pattern Forming Method

Figure 4:
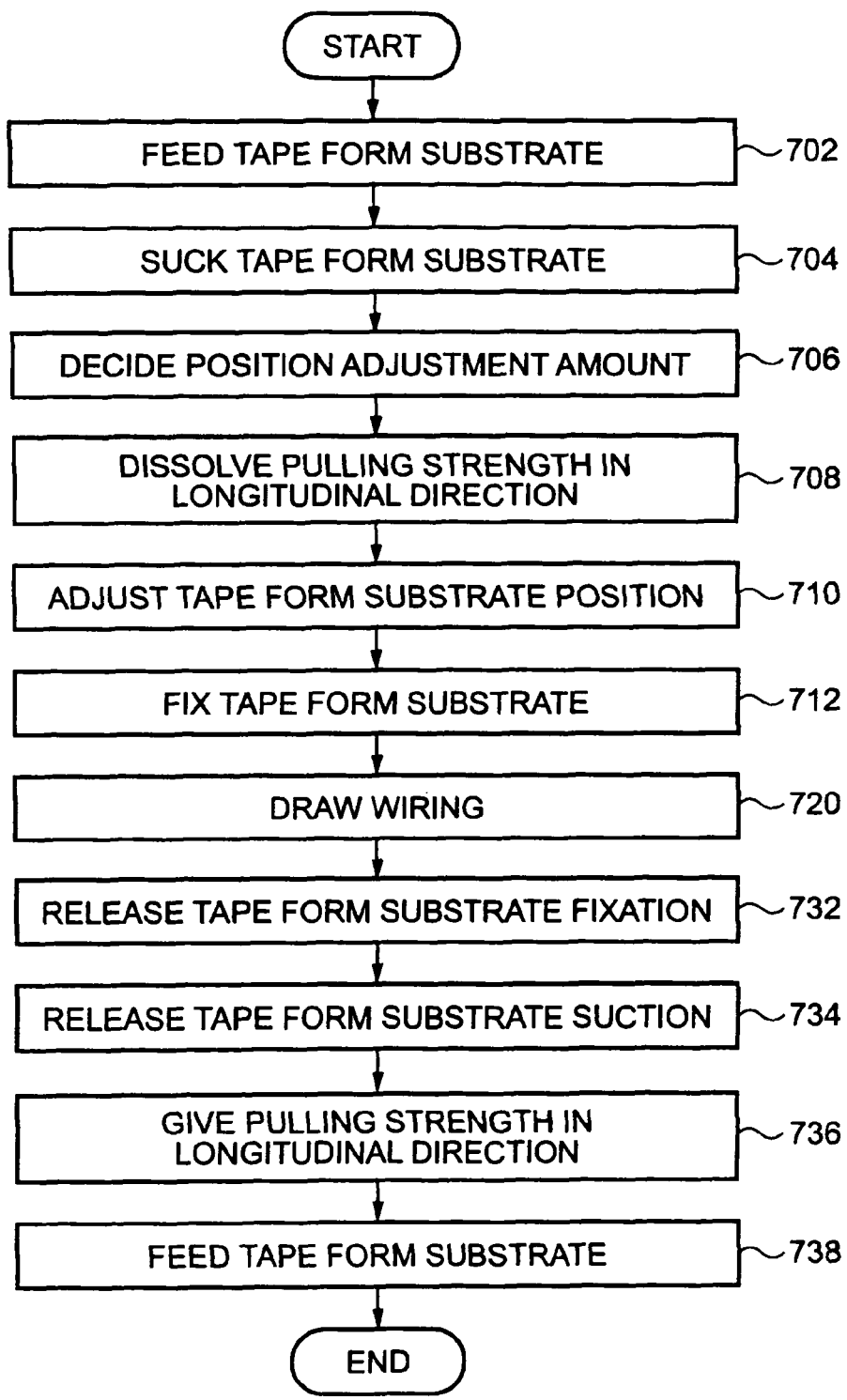
FIG. 4 is a flowchart of detailed processes of a wiring drawing step.

FIG. 4 is a flowchart of detailed processes of a wiring drawing step. Now, each of the detailed processes shown in FIG. 4 will be described using a diagram in FIG. 2 that schematically shows a wiring drawing step.

First, a tape form substrate is fed to a predetermined position (Step 702). Specifically, a unit area on the tape form substrate 11 on which a wiring to be formed is moved onto the table 4 in the wiring drawing step by feeding the tape form substrate 11 from the feeding reel 10 and winding up with the winding reel 15. Then, the tape form substrate 11 is sucked by a suction unit placed on the table 4 (Step 704). Thus, the relative position of the unit area on the tape form substrate 11 to the table 4 is fixed.

Then, the amount of the position adjustment of the tape form substrate 11 is decided (Step 706). In the peripheral part of the unit area of the tape form substrate 11, alignment marks are precedently drawn and formed by using technologies such as photo lithography. The current position of the unit area is detected by picking up the image of the alignment marks using a CCD camera (not shown) or the like. Next, the amount of displacement of the current position to the predetermined position on the unit area in the θ direction is calculated. Then, the calculated amount of displacement is defined as an amount of the position adjustment.

Then, the pulling strength in the longitudinal direction of the tape form substrate 11 is dissolved (Step 708). The dissolving of the pulling strength is carried out by slacking off the tape form substrate 11 on the slack mechanisms 50 and 60 that are set up on the both ends of the table 4. In the above-referenced feeding step of the tape form substrate 11 (Step 702), the pulling roller 66 is pressed toward the tape form substrate 11, giving pulling strength in the longitudinal direction of the tape form substrate 11. The pulling roller 66 is moved upward to slack off the tape form substrate 11, dissolving the pulling strength in the longitudinal direction of the tape form substrate 11. The slack mechanisms 50 works just in the same way.

Next, the position of the tape form substrate 11 is adjusted (Step 710). Specifically, in accordance with the position adjustment amount that is calculated in Step 706, the table 4 is slewed around in the θ direction with a motor 4*a*. In so doing, the tape form substrate 11 that is sucked on the table 4 can be moved, following the slewing of the table 4, for only a predetermined amount in the θ direction, because the pulling strength in the longitudinal direction of the tape form substrate 11 is dissolved by the slack mechanisms 50 and 60 on the both ends of the table 4. Thus, the unit area of the tape form substrate 11 can be placed on a predetermined position.

Next, the tape form substrate 11 is fixed at the edge of the table 4 (Step 712). At the slack mechanism 60, for example, the fixed roller 68 is moved downwards toward the movable roller 62 that is closer to the table 4 to interpose the tape form substrate 11 between the movable roller 62 and the fixed roller 68. Thus, the slack of the tape form substrate in the slack mechanism 60 can be prevented from affecting the table 4, stabilizing the position of the tape form substrate 11 on the table 4.

Then, a wiring is drawn with a droplet discharge method (Step 720). A wiring is formed on a unit area by discharging a droplet containing a forming material of a wiring while scanning an ink jet head 30 within the parallel surface of the tape form substrate 11, details of which will be described later. In the embodiment, the position adjustment of the tape form substrate 11 in the θ direction is carried out by slewing the table 4 as described above, while the position adjustment in the X and Y directions is carried out by adjusting the amount of transferring the ink jet head 30. However, all the position adjustments in each direction can be carried out on the table 4, in the case, for example, of forming the table 4 so as to be able to move not only in the θ direction but also in the X and Y directions.

Next, the fixation of the tape form substrate 11 on the edge of the table 4 is released (Step 732). For example, at the slack mechanism 60, the interposing of the tape form substrate 11 is released by alienating the fixed roller 68 from the movable roller 62 that is closer to the table 4. Next, the suction of the tape form substrate 11 by the table 4 is released (Step 734). Thus, the tape form substrate 11 is freed from the restraint by the table 4 and the like, returning on the straight line connecting the feeding reel 10 and the winding reel 15.

Next, pulling strength is generated in the longitudinal direction of the tape form substrate 11 (Step 736). For example, at the slack mechanism 60, the tape form substrate 11 is pressed by moving downwards the pulling roller 66 to make the slacked tape form substrate 11 strained, giving pulling strength in the longitudinal direction of the tape form substrate 11. The slack mechanisms 50 works just in the same way. Then, the tape form substrate 11 is fed to the next step (Step 738). The tape form substrate 11 can be fed by slewing the winding reel because pulling strength is given to the tape form substrate 11, as described above. Thus, the unit area on the tape form substrate 11 on which a wiring drawing step is finished is fed to the next step.

As described above, the pattern forming system of the embodiment includes a droplet discharge apparatus, which is placed between a feeding reel and a winding reel of a tape form substrate, for discharging a droplet onto the tape form substrate to form a pattern. The droplet discharge apparatus includes a table that sucks a placed tape form substrate and can adjust the position of the tape form substrate, with a slack mechanism for the tape form substrate being placed on the both ends of the table in the longitudinal direction of the tape form substrate to dissolve the pulling strength that affects in the longitudinal direction of the tape form substrate. Because the tape form substrate constituting a reel-to-reel substrate is successively formed in the longitudinal direction, the position adjustment is more difficult compared with the case of single substrate. In the pattern forming system of the embodiment, the pulling strength that affects in the longitudinal direction of the tape form substrate is dissolved because a slack mechanism for the tape form substrate is set up. By moving, in this state of things, the table that sucks the tape form substrate, the position adjustment of the tape form substrate can be easily done. Thus, a pattern forming system that can form a precise pattern can be provided.

A Droplet Discharge Apparatus

Figure 5A:
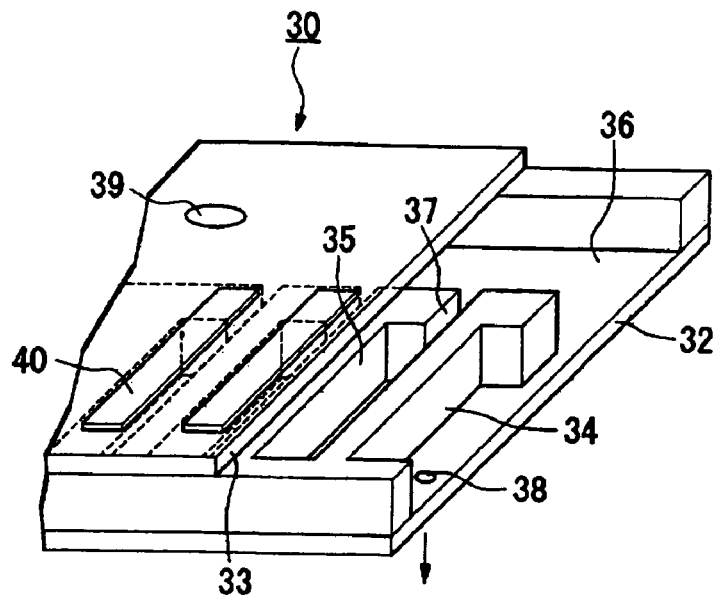
FIGS. 5A and 5B are diagrams explaining an ink jet head.

Next, the above-referenced ink jet head will be specifically described with reference to FIG. 5. FIGS. 5A and 5B are diagrams explaining an ink jet head, FIG. 5A being an oblique diagram of a substantial part while FIG. 5B being a sectional view of a substantial part. FIG. 6 is a bottom plan view of an ink jet head. As shown in FIG. 5A, an ink jet head 30 includes a nozzle plate 32 and a diaphragm 33 that are, for example, stainless and are joined via a compartment item (a reservoir plate) 34. A plurality of spaces 35 and a liquid receiver 36 are formed with the compartment items 34 between the nozzle plate 32 and the diaphragm 33. The inside of each of the spaces 35 and the liquid receiver 36 is filled with liquid matter, each of the spaces 35 and the liquid-receiver 36 being communicable via a feed pocket 37. On the nozzle plate 32, a plurality of nozzle holes 38 for spraying liquid matter from the spaces 35 is formed in line, both lengthwise and crosswise. A hole 39 is formed on the diaphragm 33 for supplying liquid matter into the liquid receiver 36.

Figure 5B:
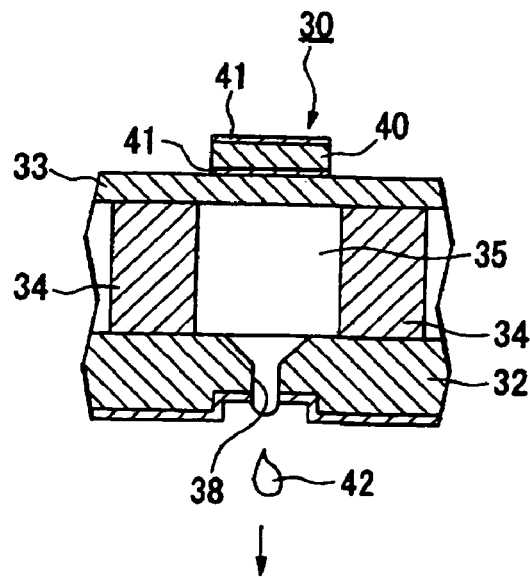

As shown in FIG. 5B, a piezo device 40 is jointed on the surface of the diaphragm 33, on the opposite side of the surface facing to the space 35. The piezo device 40 is placed between a pair of electrodes 41 and is configured to stick out outside when electricity is turned on. The diaphragm 33 to which the piezo device 40 is jointed in such configuration also sticks out outside together with the piezo device 40, augmenting the capacity of the space 35. Thus, liquid matter the amount of which equals to the augmented capacity in the space 35 flows in from the liquid receiver 36 via the feed pocket 37. Canceling, in this state of things, the electricity to the piezo device 40 returns the piezo device 40 and the diaphragm 33 to the former shape. Thus, the capacity of the space 35 also returns to the former capacity, which raises the pressure of the liquid matter within the space 35, causing a droplet 42 of the liquid matter to be discharged from the nozzle hole 38 onto a substrate.

A piezo device 40 is set up separately for each of the nozzle holes 38 so that a discharging operation is carried out separately. Specifically, the amount of droplets to be discharged from each nozzle can be adjusted and changed by controlling discharge waveforms that are electrical signals to be sent to the piezo device 40. As a method of the ink jet head 30, it is not limited to the above-referenced piezo ink jet type using a piezo device 40. A thermal method, for example, can also be adopted. In that case, the amount of droplets to be discharged can be changed by, for example, changing the applying time.

A Wiring Pattern

Figure 6A:
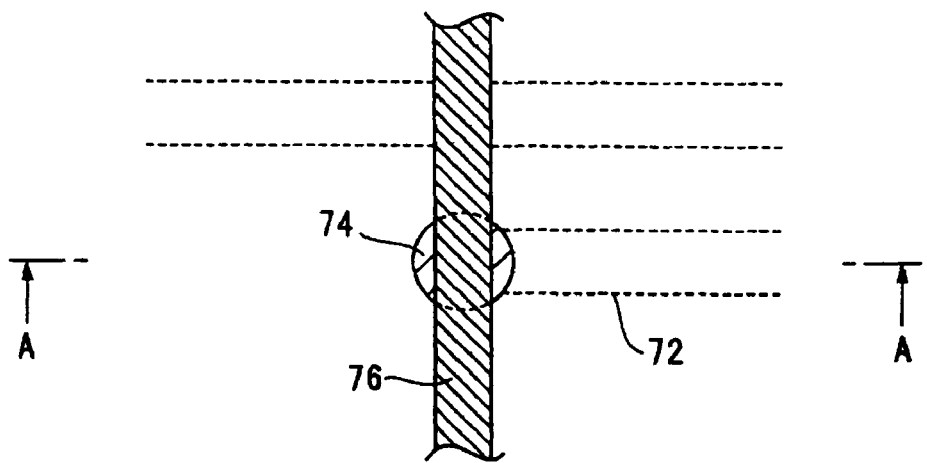
FIGS. 6A and 6B are diagrams explaining a wiring pattern.
Figure 6B:
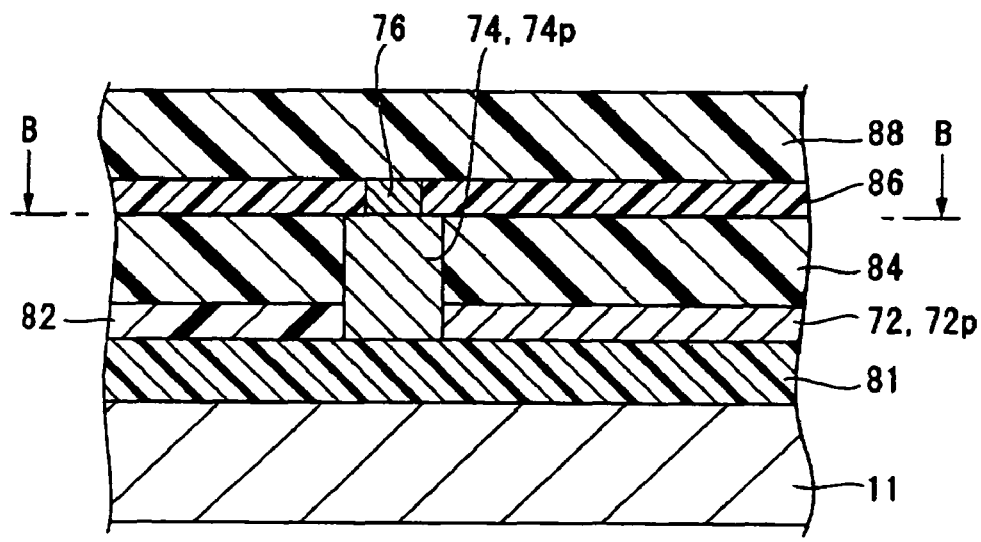

Next, an example of a wiring pattern that is formed by using a droplet discharge method will be described. FIG. 6 is a diagram explaining an example of a wiring pattern. FIG. 6A is a two-dimensional sectional view of FIG. 6B on the B-B line, while FIG. 6B is a lateral sectional view of FIG. 6A on the A-A line. The pattern shown in FIG. 6B is configured so that a lower layer electrical wiring 72 and an upper layer electrical wiring 76 are laminatedly formed via an interlayer insulator film 84 and are conductively connected to each other through a conductive post 74. Note that the wiring pattern described below is only an example and the invention is applicable also for other wiring patterns than the one in the example.

The wiring pattern shown in FIG. 6B is formed on the surface of the above-referenced tape form substrate 11. A base insulator film 81 is formed on the surface of the tape form substrate 11. The base insulator film 81 is composed of an electric insulating material, the main component of which being an ultraviolet ray hardening resin, such as an acrylic.

A plurality of electrical wirings 72 is formed on the surface of the base insulator film 81. The electrical wirings 72 are formed in predetermined patterns with conductive materials, such as Ag. Meanwhile, an interlayer insulator film 82 is formed, on the surface of the base insulator film 81, on the area where no electrical wiring 72 is formed. The line/space of the electrical wirings 72 is refined, for example, to 30/30 μm by employing a droplet discharge system.

An interlayer insulator film 84 is formed in a manner of mainly covering the electrical wirings 72. The interlayer insulator film 84 is also composed of the same resin material as that used for the base insulator film 81. A conductive post 74 with an appropriate height is formed, upwards from an edge of the electrical wirings 72, in a manner of piercing the interlayer insulator film 84. The conductive post 74 is formed with a columnar structure and composed of the same conductive materials as those used for the electrical wirings 72, such as Ag. Here, by way of example, the thickness of the electrical wirings 72 is about 2 μm and the height of the conductive post 74 is about 8 μm.

An upper layer electrical wiring 76 is formed on the surface of the interlayer insulator film 84. Like the lower layer electrical wirings 72, the upper electrical wiring 76 is also composed of conductive materials, such as Ag. As shown in FIG. 6A, the upper layer electrical wiring 76 may be placed so as to intersect with the lower layer electrical wirings 72. The upper layer electrical wiring 76 is connected to the top of the conductive post 74 to secure the conduction with the lower layer electrical wirings 72.

As shown in FIG. 6B, an interlayer insulator film 86 is formed on the area, on the surface of the interlayer insulator film 84, where the electrical wiring 76 is not formed. Further, an overcoat 88 is formed in a manner of mainly covering the electrical wiring 76. The interlayer insulator film 86 and the overcoat 88 are also composed of the same resin material as that used for the base insulator film 81.

Although the wiring pattern in the above described example has only two layers of electrical wirings 72 and 76, a wiring pattern may have electrical wirings with more than two layers. In such a case, the structure from the n-th layer electrical wiring to the n+1-th layer electrical wiring may be formed just in the same way as the structure from the first layer electrical wiring 72 to the second layer electrical wiring 76 is formed.

A Wiring Pattern Forming Method

Next, a method for forming the above-referenced wiring pattern will be described. FIG. 7 is an operation sheet of a wiring pattern forming method. Now, each operation will be described in numerical order in the leftmost field of FIG. 7 with reference to FIG. 6B.

First, the surface of a tape form substrate 11 is cleaned (Step 1). Specifically, excimer UV at a wavelength of 172 nm is irradiated onto the surface of the tape form substrate 11 for about 300 seconds. The tape form substrate 11 may be also cleaned using solvents, such as water, or ultrasonic waves. It is also acceptable to clean the tape form substrate 11 by irradiating plasma onto the tape form substrate 11 at a normal pressure.

Next, a bank (a peripheral part) for a base insulator film 81 is drawn and formed as a preparatory step to form the base insulator film 81 on the surface of the tape form substrate 11 (Step 2). The drawing is done using a droplet discharge system (an inkjet system). Specifically, a resin material before hardened, which is a forming material of the base insulator film 81, is discharged along the peripheral part of the area for forming the base insulator film 81, by using a droplet discharge apparatus to be described later. Next, the discharged resin material is hardened (Step 3). Specifically, UV at a wavelength of 365 nm is irradiated onto the base insulator film 81 for about 4 seconds to harden a UV hardening resin, which is a forming material of the base insulator film 81. Thus, a bank is formed on the peripheral part of the area for forming the base insulator film 81.

Next, a base insulator film 81 is drawn and formed within the resulting bank (Step 4). The drawing is also done using a droplet discharge system. Specifically, a droplet discharge head of the above-referenced droplet discharge apparatus is scanned throughout the inside of the bank while a resin material before hardened, which is a forming material of the base insulator film 81, is discharged from the ink jet head. Here, the discharged resin material will not spread beyond the area for forming the base insulator film 81, because the discharged resin material is backed up at the bank on the peripheral part even in case where the discharged resin material flows. Next, the discharged resin material is hardened (Step 5). Specifically, UV at a wavelength of 365 nm is irradiated for about 60 seconds to harden a UV hardening resin, which is a forming material of the base insulator film 81. Thus, a base insulator film 81 is formed on the surface of the film substrate 11.

Next, the contact angle on the surface of the base insulator film 81 is adjusted as a preparatory step to form an electrical wiring 72 on the surface of the base insulator film 81 (Step 6). As will be described below, in the discharging of a droplet containing a forming material of an electrical wiring 72, too large contact angle on the surface of the base insulator film 81 causes the discharged droplet to become spherical, making it difficult to form an electrical wiring 72 with a predetermined form and on a predetermined position. Meanwhile, too small contact angle on the surface of the base insulator film 81 causes the discharged droplet to spread out, making it difficult to refine an electrical wiring 72. Because the surface of the base insulator film 81 after hardened has a liquid repellency, the contact angle on the surface of the base insulator film 81 can be adjusted by irradiating excimer UV at a wavelength of 172 nm onto the surface for about 15 seconds. The modification degree of the liquid repellency can be adjusted not only with the irradiation time of the ultraviolet light but also with the combinations of intensity and wavelength of an ultraviolet light and a heat treatment (heating) and the like. As other methods for lyophilic treatment, there are treatments, such as a plasma treatment in which oxygen is used as a reaction gas and a treatment in which a substrate is exposed to ozone atmosphere.

Next, a liquid line 72*p*, which will later become an electrical wiring, is drawn and formed on the surface of the base insulator film 81 (Step 7). The drawing is done using a droplet discharge system that uses a droplet discharge apparatus to be described later. Here, a dispersion liquid in which conductive microparticles, which is a forming material of an electrical wiring, are dispersed in a dispersion medium is discharged. As conductive microparticles, silver is preferably used. In addition, metal microparticles that contain any of gold, copper, palladium, or nickel, and microparticles of conductive polymer or superconducting properties can be also used.

As for the conductive microparticles, the surfaces can be coated, for example, with organic matters for the purpose of improving the dispersibility. Polymer, which induces steric hindrance and electrostatic repulsion, for example, is an example of coating materials to be applied onto the surfaces of conductive microparticles. Further, it is preferable that the diameter of the conductive microparticles is in the range of 5 nm to 0.1 μm. This is because a particle that is greater than 0.1 μm in diameter easily causes the nozzles to be clogged, making the discharging from a droplet discharge head difficult. In the meanwhile, a particle that is smaller than 5 nm in diameter means a large volume proportion of the coating materials to the conductive microparticles, causing an excessively large proportion of the organic matters in the resulting electric conductor.

Dispersion media to be used are not particularly limited as long as the above-referenced conductive microparticles can be dispersed without causing coagulation. In addition to water, alcohols such as methanol, ethanol, propanol, and butanol, hydrocarbon compounds such as n-heptane, n-octane, decane, toluene, xylene, cymene, durene, indene, dipentene, tetrahydronaphthalene, decahydronaphthalene, and cyclohexylbenzene, ethers compounds such as ethylene glycol dimethyl ether, ethylene glycol diethyl ether, ethylene glycol methyl ethyl ether, diethyleneglycol dimethyl ether, diethylene glycol diethyl ether, diethylene glycol methyl ethyl ether, 1,2-dimethoxyethane, Bis(2-methoxyethyl)ether, and p-dioxane, and polar compounds such as propylene carbonate, gamma-butyrolactone, N-methyl-2-pyrrolidone, dimethylformamide, dimethyl sulfoxide, and cyclohexanone are acceptable. Among these, water, alcohols, hydrocarbon compounds, and ethers compounds are preferable in terms of the dispersibility of particles, the stability of dispersion liquid, and the applicability to a droplet discharge system. In particular, water and hydrocarbon compounds are specifically preferable dispersion media. These dispersion media can be used as a mixture of more than two kinds of materials as well as by itself.

As for dispersion media for a droplet containing conductive microparticles, it is preferable that its steam pressure at room temperature is in the range of 0.001 mmHg to 200 mmHg (that is, in the range of about 0.133 Pa to 26600 Pa). This is because a dispersion medium, in the case where the steam pressure is higher than 200 mmHg, evaporates too quickly after the discharging, making it difficult to form a good electric conductor. Further, the steam pressure of dispersion media is preferable in the range of 0.001 mmHg to 50 mmHg (that is, in the range of about 0.133 Pa to 6650 Pa). This is because a nozzle, in the case where the steam pressure is higher than 50 mmHg, is easily clogged due to dryness in the discharging of droplets using a droplet discharge system, making a stable discharging difficult. In the meanwhile, in the case where the steam pressure of a dispersion medium is lower than 0.001 mmHg at room temperature, the dispersion medium evaporates too slowly and is inclined to remain in the electric conductor, making it difficult to get a good electric conductor after a heat treatment and/or a light treatment, which will be done as post-processes.

The dispersoid concentration in dispersing the conductive microparticles into a dispersion medium may be in the range of 1 mass percent to 80 mass percent, and can be adjusted according to a desired thickness for an electric conductor. When the concentration surpasses 80 mass percent, the dispersion liquid is prone to coagulation, which makes it difficult to get a uniform electric conductor.

It is preferable that the surface tension of the dispersion liquid for the conductive microparticles is in the range of 0.02 N/m to 0.07 N/m. This is because when the surface tension is smaller than 0.02 N/m in discharging a droplet in a droplet discharge system, the wetting property of the ink composition toward the nozzle surface increases and induces jet deflection, while when the surface tension is greater than 0.07 N/m, the form of the meniscus on the top of the nozzles is unstable and makes it difficult to control a rate and a timing of discharging. To adjust a surface tension, a minute amount of surface tension regulants, such as fluorine-containing compounds, silicon-containing compounds, and nonion-containing compounds, can be added to the dispersion liquid within the limits of not lowering unreasonably the contact angle with the base insulator film 51. Nonion-containing surface tension regulants improves the wetting property toward the base insulator film 51 and the levelling of the film, and is effective in preventing the occurrence of jaggies and orange peels and the like on the coating film. The dispersion medium may, if necessary, include organic compounds, such as alcohol, ether, ester, and ketone.

It is preferable that the viscosity of the dispersion medium is in the range of 1 mPa·s to 50 mPa·s. This is because when the viscosity is smaller than 1 mPa·s in discharging a droplet in a droplet discharge system, the peripheral part of a nozzle is easily polluted with the ink flowage, while when the viscosity is greater than 50 mPa·s the nozzle aperture is more frequently clogged, making it difficult to discharge a droplet smoothly.

According to the embodiment, a droplet (a first droplet) of the dispersion liquid is discharged from a droplet discharge head onto a position on which an electrical wiring to be formed. In the discharging, it is preferable to adjust the overlapping of droplets to be discharged in succession so as to prevent the occurrence of bulge. Specifically, it is preferable to use a discharging method in which a plurality of droplets is discharged, in a first discharging, at certain intervals so as not to touch each other, and then the intervals are filled in during the subsequent discharging. A liquid line 72p is formed on the surface of the base insulator film 81, following the steps described above.

Before forming the liquid line 72p on the tape form substrate 11, the position of the tape form substrate 11 is adjusted according to Steps 702 to 712 in FIG. 4. Then, after forming the liquid line 72p, the tape form substrate 11 is fed to the next step according to Steps 732 to 738 in FIG. 4.

Next, as shown in FIG. 6B, the liquid line 72p is baked (Step 8). Specifically, the tape form substrate 11 on which the liquid line 72p is formed is heated on a hot plate at a temperature of 150 degrees centigrade for about 30 minutes. Although the baking is done in the ordinary air, it can also be done, if necessary, in inert gases atmosphere, such as nitrogen, argon, and helium. Further, although the temperature of the baking is, here, set to be 150 degrees centigrade, it is preferable to set the temperature taking into consideration the boiling point (steam pressure) of the dispersion medium included in the liquid line 72p, the type and the pressure of the atmosphere gases, thermal behaviors of the particles, such as dispersibility and oxidativity, the presence and the amount of a coating material, and a heat resistance of the substrate.

The baking process can be done not only by using an ordinary hot plate or an electric furnace but also by using a lamp anneal. As a light source to be used for a lamp anneal, although it is not limited particularly, infrared lamp, xenon lamp, YAG laser, argon laser, carbon dioxide laser, and excimer laser such as XeF, XeCl, XeBr, KrF, KrCl, ArF, and ArCl can be used. Although these light sources are generally used with the output power in the range of 10 W to 5000 W, the range of 100 W to 1000 W is sufficient in the embodiment.

After the baking, the dispersion medium contained in the liquid line 72p is volatilized, securing an electrical connection between the conductive microparticles. Thus, an electrical wiring 72 is formed.

Next, a liquid post 74p, which will be a conductive post, is drawn and formed on an edge of the baked electrical wiring 72 (Step 9). The drawing is done using a droplet discharge system that uses the above-referenced droplet discharge apparatus, just like the drawing of a liquid line 72p in Step 7. Here, a droplet (a second droplet) of the dispersion liquid in which conductive microparticles, which are a forming material of the liquid post 74, are dispersed in an dispersion medium is discharged. Specifically, the droplet is the same as the liquid matter that is used for the drawing of the liquid line 72p. Specifically, a second droplet can be discharged, after the liquid line 72p is drawn, onto a forming position of a conductive post 74 using the same droplet discharge head in which the same liquid matter is filled.

It is preferable that the position of the tape form substrate 11 is adjusted according to Steps 702 to 712 in FIG. 4 before forming the liquid post 74p, just like before forming the liquid line 72p. Here, the liquid line 72p and the liquid post 74p can be drawn using the same droplet discharge apparatus. Then, after forming the liquid post 74p, the tape form substrate 11 is fed to the next step according to Steps 732 to 738 in FIG. 4.

Next, as shown in FIG. 6B, the drawn and formed liquid post 74p is baked (Step 10). The baking is done by heating the tape form substrate 11 on which the liquid post 74p is formed on a hot plate at a temperature of 150 degrees centigrade for about 30 minutes. Thus, the dispersion medium contained in the liquid post 74p is volatilized, securing an electrical connection between the conductive microparticles. Thus, the liquid post 74p is formed.

Next, the contact angle on the surface of the base insulator film 81 is adjusted as a preparatory step to form an interlayer insulator film 82 on the formative layer of the electrical wiring 72 (Step 11). As the hardened surface of the base insulator film 81 has a liquid repellency, excimer UV at a wavelength of 172 nm is irradiated onto the surface for about 60 seconds to add a lyophilic property.

Next, an interlayer insulator film 82 is drawn and formed around the electrical wiring 72 (Step 12). The drawing is also done using the droplet discharge apparatus, just like the drawing of a base insulator film 81. Here, voids are placed around the conductive post 74 and around the electrical wiring 72, with the resin material being discharged outside the voids.

Next, excimer UV at a wavelength of 172 nm is irradiated onto the voids around the conductive post 74 and around the electrical wiring 72 for about 10 seconds as a lyophilic treatment (Step 13). Thus, a lyophilic property is added to the voids around the conductive post 74 and around the electrical wiring 72, letting the resin material flow into the voids and contact with the conductive post 74 and the electrical wiring 72. Here, the resin material wetly mounts on the surface of the electrical wiring 72, but not on the top of the conductive post 74. Therefore, conduction can be secured between the conductive post 74 and the upper layer electrical wiring 76. Then, the discharged resin material is hardened (Step 14). Specifically, UV at a wavelength of 365 nm is irradiated for about four seconds to harden a UV hardening resin, which is a forming material of an interlayer insulator film 82. Thus, an interlayer insulator film 82 is formed.

Next, an interlayer insulator film 84 is drawn and formed mainly on the surface of the electrical wiring 72 (Step 15). The drawing is also done using the droplet discharge apparatus, just like the drawing of a base insulator film 81. Here again, it is preferable that a resin material is discharged after a void is placed around the conductive post 74. Next, the discharged resin material is hardened (Step 16). Specifically, LW at a wavelength of 365 nm is irradiated for about 60 seconds to harden a LW hardening resin, which is a forming material of an interlayer insulator film 84. Thus, an interlayer insulator film 84 is formed.

Next, an upper layer electrical wiring 76 is formed on the surface of the interlayer insulator film 84. The specific processes are the same with those in Steps 6 to 10 for forming a lower layer electrical wiring 72. Then, an interlayer insulator film 86 is formed on the formative layer of the electrical wiring 76. The specific processes are the same with those in Steps 11 to 14 for forming an interlayer insulator film 82 on the formative layer of the electrical wiring 72. Further, by doing Steps 15 and 16, an interlayer insulator film can be formed on the surface of the upper layer electrical wiring 76.

By repeating the processes in Steps 6 to 16, electrical wirings can be laminatedly placed. On the surface of the top layer of the electrical wirings, it is preferable to form an overcoat 88 using the same processes in Steps 15 and 16. In this way, a wiring pattern of the embodiment shown in FIG. 6 is formed.

Each of the above-referenced steps is done sequentially between the feeding reel 10 and the winding reel 15 that are shown in FIG. 1. Specifically, by staggering the tape form substrate 11 from the droplet discharge apparatus once a pattern is formed on a unit area using the droplet discharge apparatus, wiring patterns can be formed very easily also on the other unit areas on the tape form substrate 11. Thus, according to the embodiment, wiring patterns can be easily and quickly formed for each of the unit areas (each substrate area) on the tape form substrate 11 constituting a reel-to-reel substrate, making it possible to manufacture wiring substrates and the like efficiently and in volume.

Further, according to the embodiment, a plurality of steps, including a droplet discharge step, is carried out from the feeding out of a tape form substrate 11 constituting a reel-to-reel substrate from the feeding reel 10 until the winding up of the tape form substrate with the winding reel 15. Thus, only by winding up one edge of the tape form substrate 11 with the winding reel 15, the tape form substrate 11 can be moved from the position on which the previous step has been carried out to the position on which the next step is carried out. Thus, according to the embodiment, a transport mechanism for transferring a tape form substrate 11 to each apparatus for each step can be simplified, reducing the installation space for the manufacturing apparatuses, which eventually reduces the manufacturing cost in the case of volume production and the like.

An Electro-optic Device

Figure 8:
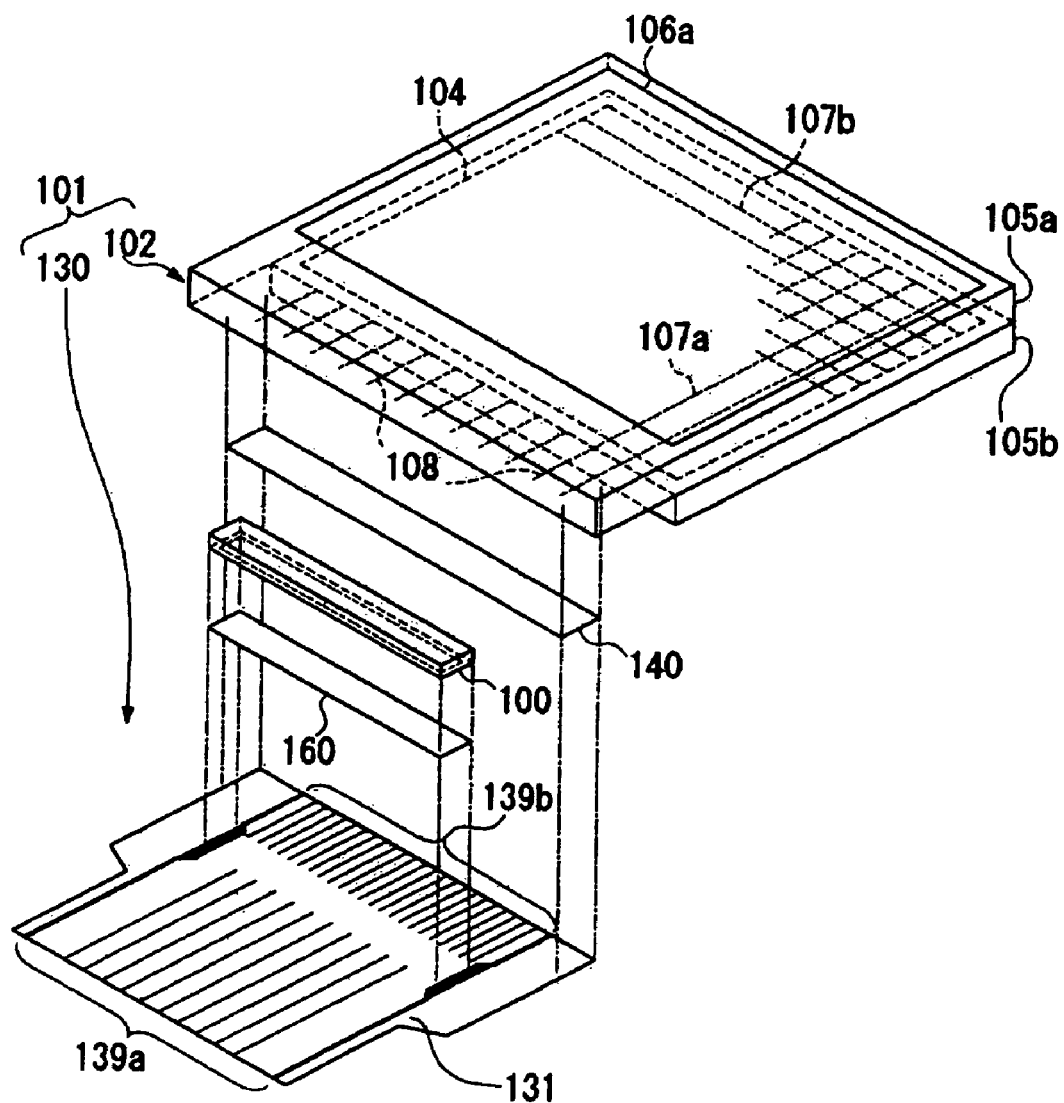
FIG. 8 is an exploded oblique diagram of a liquid crystal module with a COF structure.

Flexible Printed Circuit (hereinafter, simply referred to as an "FPC") can be formed using the above-referenced wiring pattern forming method. Thus, a liquid crystal module will now be described as an example of electro-optic devices that adopt the FPC. FIG. 8 is an exploded oblique diagram of a liquid crystal module with a COF (Chip On Film) structure. The liquid crystal module 101 mainly includes a liquid crystal panel 102 for color display, FPC 130 that is connected to the liquid crystal panel 102, and a liquid crystal driving IC 100 that is mounted on FPC 130. Further, a lighting system, such as a backlight, and other accompanying devices are attached to the liquid crystal panel 102, if necessary.

The liquid crystal panel 102 includes a pair of substrates 105a and 105b, which are attached to each other with a seal material 104. A liquid crystal is inserted into a void, so-called cell gap, between the substrates 105a and 105b. In other words, the liquid crystal is interposed with the substrates 105a and 105b. The substrates 105a and 105b are generally composed of translucent materials, such as glass and synthetic resin. A deflecting plate 106a is attached on the outside surface of the substrates 105a and 105b.

An electrode 107a is formed on the inside surface of the substrate 105a while an electrode 107b is formed on the inside surface of the substrate 105b. The electrodes 107a and 107b are composed, for example, of translucent materials, such as ITO (Indium Tin Oxide). The substrate 105a has an overhanging part to the substrate 105b, a plurality of terminal posts 108 being formed on the overhanging part. The terminal posts 108 are formed together with an electrode 107a when the electrode 107a is formed on the substrate 105a. Therefore, the terminal posts 108 are formed, for example, with ITO. Among the terminal posts 108, some outlie directly from the electrode 107a and others are connected to the electrode 107b via a conductive material (not shown).

Meanwhile, on the surface of FPC 130, wiring patterns 139a and 139b are formed by the method for forming a wiring pattern according to the embodiment. Specifically, an input wiring pattern 139a is formed from one side of FPC 130 toward the center, while an output wiring pattern 139b is formed from the opposite side of FPC 130 toward the center. Electrode pads (not shown) are formed on the other sides, which are closer to the center, of the input wiring pattern 139a and the output wiring pattern 139b.

A liquid crystal driving IC 100 is mounted on the surface of FPC 130. Specifically, a plurality of bump electrodes that is formed on the active surface of the liquid crystal driving IC 100 is connected to the plural electrode pads that are formed on the surface of FPC 130 via ACF (Anisotropic Conductive Film) 160. The ACF 160 is formed by dispersing a plurality of conductive particles into an adhesive resin, which has thermoplasticity or a thermosetting property. Thus, a so-called COF structure is achieved by fitting a liquid crystal driving IC 100 on the surface of FPC 130.

Then, FPC 130 having the liquid crystal driving IC 100 is connected to the substrate 105a of the liquid crystal panel 102. Specifically, an output wiring pattern 139b of FPC 130 is connected electrically to the terminal posts 108 on the substrate 105a via ACF 140. Here, space saving can be achieved by folding because FPC 130 is flexible.

In a liquid crystal module 101 configured according to the method described above, a signal is input into a liquid crystal driving IC 100 via an input wiring pattern 139a on FPC 130. Then, a driving signal is output from the liquid crystal driving IC 100 to the liquid crystal panel 102 via an output wiring pattern 139b on FPC 130. Thus, an image is displayed on the liquid crystal panel 102.

In addition to devices that have an electro-optic effect that changes transmissivity of light by changing the refraction factor of materials by electric field, devices that transform electric energy into optical energy are also electro-optic devices of the invention. Specifically, the invention is widely applicable not only for liquid crystal display devices but also for luminescent devices, such as organic EL (Electro-Luminescence) devices, inorganic EL devices, plasma display devices, electrophoretic display devices, and display devices using electron emission elements (such as Field Emission Display and Surface-Conduction Electron-Emitter Display). For example, FPC having a wiring pattern according to the invention can be connected to an organic EL panel to compose an organic EL module.

An Electronic Apparatus

Figure 9:
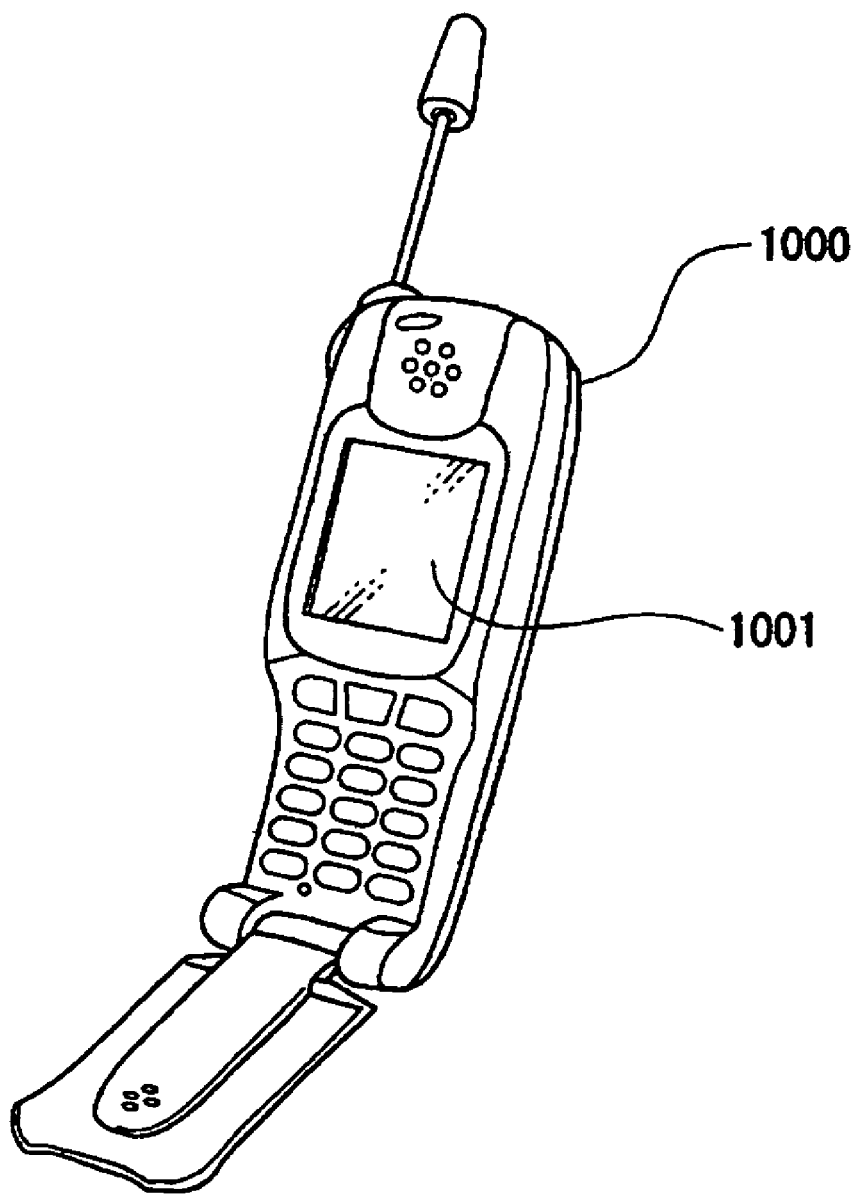
FIG. 9 is an oblique diagram of a cellular phone.

Next, an electronic apparatus manufactured using a pattern forming method of the embodiment will be described with reference to FIG. 9. FIG. 9 is an oblique diagram of a cellular phone. In FIG. 9, the number 1000 indicates a cellular phone, and the number 1001 indicates a display part. An electro-optic device having a wiring pattern of the embodiment is adopted to the display part 1001 of the cellular phone 1000. Therefore, a small cellular phone 1000 that has a highly reliable electrical connection can be provided. The invention can be used as an image displaying method, not only for the above-referenced cellular phone but also for electronic apparatuses, such as electronic books, personal computers, digital still cameras, liquid crystal televisions, video tape recorders (viewfinder types or monitor types), car navigation systems, pagers, electronic organizers, desktop calculators, word processors, workstations, videophones, POS terminals, and touch panels. In any case, a small electronic apparatus that has a highly reliable electrical connection can be provided.

The technology range of the invention is not limited to the above-referenced embodiments, but may include the embodiments in which various changes are added to the above-referenced embodiments within the limits of not deviating from the purposes of the invention. Specifically, the specific materials and configurations described above in the embodiments are only the examples and changes are supposed to be added.

What is claimed is:

1. A pattern forming method using a pattern forming system that includes a feeding reel for feeding a tape form substrate that is wound up, a winding reel for winding up the tape form substrate that is fed up, and a droplet discharge apparatus for discharging a droplet onto the tape form substrate, between the feeding reel and the winding reel, to form a pattern, the method comprising:
    affixing the tape form substrate to a table portion of the droplet discharge apparatus by suction,
    dissolving the pulling strength generated in the longitudinal direction of the tape form substrate, wherein the pulling strength is dissolved by moving a first roller placed on a slack portion of the tape form substrate,
    adjusting the position of the tape form substrate by moving the table portion,
    fixing the tape form substrate to the table portion by moving a second roller to prevent a slack of the tape form substrate from affecting the table portion, and
    forming the pattern by discharging a droplet on the tape form substrate using the droplet discharge apparatus.

2. The pattern forming method according to claim 1, further, after forming the pattern by discharging the droplet onto the tape form substrate using the droplet discharge apparatus, comprising:
    releasing the suction of the tape form substrate by the table,
    bringing out pulling strength in the longitudinal direction of the tape form substrate, and
    winding up the tape form substrate by the winding reel.

3. The pattern forming method according to claim 1, wherein the second roller is placed between a first portion of the tape form substrate and a second portion of the tape form substrate, wherein the first portion is affixed by suction and the second portion is dissolved the pulling strength by the first roller.

* * * * *